United States Patent
Rajski et al.

(10) Patent No.: US 9,651,622 B2
(45) Date of Patent: May 16, 2017

(54) ISOMETRIC TEST COMPRESSION WITH LOW TOGGLING ACTIVITY

(71) Applicant: Mentor Graphics Corporation, Wilsonville, OR (US)

(72) Inventors: Janusz Rajski, West Linn, OR (US); Amit Kumar, Marlborough, MA (US); Mark A. Kassab, Wilsonville, OR (US); Elham Moghaddam, Beaverton, OR (US); Nilanjan Mukherjee, Wilsonville, OR (US); Jerzy Tyszer, Poznan (PL); Chen Wang, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 25 days.

(21) Appl. No.: 14/642,501

(22) Filed: Mar. 9, 2015

(65) Prior Publication Data
US 2015/0253385 A1    Sep. 10, 2015

Related U.S. Application Data (60) Provisional application No. 61/949,917, filed on Mar. 7, 2014.

(51) Int. Cl.
*G01R 31/28* (2006.01)
*G01R 31/3183* (2006.01)
*G01R 31/3185* (2006.01)

(52) U.S. Cl.
CPC ........ *G01R 31/318342* (2013.01); *G01R 31/318547* (2013.01); *G01R 31/318583* (2013.01)

(58) Field of Classification Search
CPC .... G01R 31/318342; G01R 31/318547; G01R 31/318583; G01R 31/318575; G01R 31/318544; G01R 31/318335; G01R 31/318519; G01R 31/31921; G01R 31/3016; G01R 31/31727; G01R 31/31725; G11C 29/10; G11C 29/56; G11C 2029/5002; G06F 11/24
See application file for complete search history.

(56) References Cited

U.S. PATENT DOCUMENTS

| | | |
|---|---|---|
| 7,647,540 B2 | 1/2010 | Rajski et al. |
| 7,797,603 B2 | 9/2010 | Rajski et al. |
| 2007/0089001 A1* | 4/2007 | Hsu ............... G01R 31/318547 714/726 |

(Continued)

OTHER PUBLICATIONS

P. Wohl, J.A. Waicukauski, and T. Finklea, "Increasing PRPG-based compression by delayed justification," Proc. ITC, 2010, paper 9.1.

(Continued)

*Primary Examiner* — Guerrier Merant
(74) *Attorney, Agent, or Firm* — Banner & Witcoff, Ltd.

(57) ABSTRACT

Various aspects of the disclosed technology relate to techniques of creating test templates for test pattern generation. Residual test cubes for a plurality of faults are first generated based on a signal probability analysis of a circuit design. Test templates are then generated based on merging the residual test cubes. Finally, a plurality of test patterns and/or compressed test cubes are generated based on one of the test templates.

20 Claims, 9 Drawing Sheets

Flow chart 700

(56) References Cited

U.S. PATENT DOCUMENTS

| | | | |
|---|---|---|---|
| 2008/0052578 A1* | 2/2008 | Rajski | G01R 31/318335 714/729 |
| 2008/0052586 A1* | 2/2008 | Rajski | G01R 31/318335 714/741 |
| 2008/0133990 A1* | 6/2008 | Lin | G01R 31/3016 714/726 |
| 2010/0229061 A1* | 9/2010 | Hapke | G01R 31/318342 714/740 |
| 2011/0022907 A1* | 1/2011 | Jiang | G01R 31/318519 714/725 |
| 2012/0144244 A1* | 6/2012 | Dan | G11C 29/10 714/39 |
| 2012/0209556 A1* | 8/2012 | Rajski | G01R 31/318575 702/108 |
| 2012/0272110 A1 | 10/2012 | Rajski et al. | |

OTHER PUBLICATIONS

D. Czysz, G. Mrugalski, J. Rajski, and J. Tyszer, "New test data decompressor for low power applications," Proc. DAC, pp. 539-544, 2007.

D. Czysz, G. Mrugalski, J. Rajski, and J. Tyszer, "Low power test data application in EDT environment through decompressor freeze", IEEE Trans. CAD, vol. 27, pp. 1278-1290, Jul. 2008.

D. Czysz, M. Kassab, X. Lin, G. Mrugalski, J. Rajski, and J. Tyszer, "Low power scan operation in test data compression environment", IEEE Trans. CAD, vol. 28, pp. 1742-1755, Nov. 2009.

* cited by examiner

ISOMETRIC TEST COMPRESSION WITH LOW TOGGLING ACTIVITY

RELATED APPLICATIONS

This application claims the benefit of U.S. Provisional Patent Application No. 61/949,917, filed on Mar. 7, 2014, and naming Janusz Rajski et al. as inventors, which application is incorporated entirely herein by reference.

FIELD OF THE DISCLOSED TECHNIQUES

The presently disclosed techniques relates to the field of circuit testing technology. Various implementations of the disclosed techniques may be particularly useful for creating partial scan designs.

BACKGROUND OF THE DISCLOSED TECHNIQUES

Many diverse test data compression techniques are widely recognized as essential to reduce the overall test cost. In these schemes, a tester delivers compressed test patterns by using a small number of input channels while an on-chip decompressor expands them into data loaded into scan chains. The actual encoding methods typically take advantage of low test pattern fill rates. In principle, two fundamental test compression paradigms coexist. Single-phase methods, such as broadcast scan, Illinois scan, VirtualScan, or adaptive scan, employ very simple decompressors, often comprising just hardwired or reconfigurable fan-outs. These fan-outs constrain ATPG (automatic test pattern generation) by defining either temporary or permanent equivalence of scan cells. As soon as one of the scan cells gets a value assigned by ATPG, the value is automatically copied to all other equivalent scan cells. Consequently, there is no need for a separate encoding phase.

The second class includes two-phase methods represented by combinational compression, and LFSR (Linear Feedback Shift Register) coding, which subsequently evolved first into static LFSR reseeding, and then into dynamic LFSR reseeding. In particular, the Embedded Deterministic Test (EDT)—a peculiar form of dynamic reseeding—has gained broad acceptance as a reliable industrial solution. Here, ATPG first generates partially specified test cubes with many don't-care positions (unspecified bits). Subsequently these test cubes are encoded using a variety of techniques. For example, reseeding and EDT use a solver of linear equations. Until now test generation within this class was done without ATPG taking into account any information about the decompressor or the implications it might introduce. An early strategy to change this trend was to exclusively modify ATPG so that justification of certain decision nodes is delayed and combined with LFSR seed computation.

In addition to reducing data volume, test time, and test pin counts, the test compression schemes have been used successfully to limit test power dissipation. Scan toggling can consume more power than a circuit is rated for. Balancing test performance against the power consumption in a given design is therefore a challenge. Since don't-care bits are typically filled with random values, the amount of toggling during test may result in a power droop that would not occur in the chip's mission mode. The bulk of test power consumption is also attributed to unloading test responses. Consequently, the power dissipation can increase by a factor of 2-3 compared to the functional mode, and is only expected to worsen with scan patterns already consuming 30× over the mission mode's peak power. The resulting higher junction temperature and increased peak power can lead to overheating or supply voltage noise—either of which can cause a device malfunction, loss of yield, chip reliability degradation, shorter product lifetime, or a device permanent damage. Over the years, numerous techniques for power reduction during scan testing have been proposed. A thorough survey of these methods can be found in a book, "Power-Aware Testing and Test Strategies for Low Power Devices", P. Girard, N. Nicolici, and X. Wen (ed.), Springer, N.Y. 2010.

On-chip test compression is facing similar problems as far as test power is concerned. An encoding scheme should therefore allow feeding scan chains with patterns having reduced the amount of toggling. In response to these challenges, several low power test data encoding schemes were developed. Some of them rest on conventional LFSR reseeding techniques with certain extensions reducing the scan-in transition probability. In particular, the method disclosed in, "Low power mixed-mode BIST based on mask pattern generation using dual LFSR re-seeding," P. M. Rosinger, B. M. Al-Hashimi, and N. Nicolici, Proc. ICCD, pp. 474-479, 2002, uses two LFSRs whose outputs are AND-ed or OR-ed to produce actual test cubes and to decrease the amount of switching. The scheme disclosed in "Low power test data compression based on LFSR reseeding," J. Lee and N. A. Touba, Proc. ICCD, pp. 180-185, 2004, divides test cubes into blocks and only uses reseeding to encode blocks that contain transitions so that extra seeds do not compromise compression ratios. Another method, disclosed in "Low power test data application in EDT environment through decompressor freeze", D. Czysz, G. Mrugalski, J. Rajski, and J. Tyszer, IEEE Trans. CAD, vol. 27, pp. 1278-1290, July 2008, reduces the test power by using available encoding capacity to limit transitions in scan chains. Unlike reseeding, this technique freezes a decompressor in certain states, which allows loading scan chains with patterns having low transition counts. A low power decompressor disclosed in "New test data decompressor for low power applications," G. Mrugalski, J. Rajski, D. Czysz, and J. Tyszer, Proc. DAC, pp. 539-544, 2007, used in parallel with a power-aware scan controller ("Low power scan operation in test data compression environment", D. Czysz, M. Kassab, X. Lin, G. Mrugalski, J. Rajski, and J. Tyszer, IEEE Trans. CAD, vol. 28, pp. 1742-1755, November 2009), allows further reduction of toggling rates when feeding scan chains with decompressed test patterns.

Several solutions deployed or adapted in the low power test compression have originally debuted as stand-alone methods trying to tailor patterns to the requirements of tests with a reduced switching activity. These power-aware schemes assign certain non-random values to unspecified positions of test cubes causing power violations. Such don't-care bits, due to low fill rates, may also assume values minimizing the amount of transitions during scan-in shifting. The resultant runs of constant values can be encoded using run-length codes. Alternatively, a minimum transition fill replicates the value of the most recent care bit for all unspecified positions until the next care bit (specified bit). A vector modification (S. Kajihara, K. Ishida, and K. Miyase, "Test vector modification for power reduction during scan testing," Proc. VTS, pp. 160-165, 2002) and California scan architecture (K. Y. Cho, S. Mitra, and E. J. McCluskey, "California scan architecture for high quality and low power testing," Proc. ITC, paper 25.3, 2007) proceed along similar lines. The minimum transition fill (R. Sankaralingam and N. A. Touba, "Controlling peak power during scan testing,"

Proc. VTS, pp. 153-159, 2002) helps in handling unspecified positions whose locations are determined by bit stripping which checks whether turning a given bit into unspecified one will affect fault coverage. Other forms of filling capture power by assigning particular values to unspecified bits so that the number of transitions at the outputs of scan cells in the capture mode is minimized.

Challenges remain in both reducing data volume, test time, and test pin counts and lowing test power dissipation, it is desirable to develop a testing technology that can elevate compression ratios and reduce switching rates in scan chains.

BRIEF SUMMARY OF THE DISCLOSED TECHNIQUES

Various aspects of the disclosed technology relate to techniques of creating test templates for test pattern generation. In one aspect, there is a method, executed by at least one processor of a computer, comprising: generating residual test cubes for a plurality of faults based on a signal probability analysis of a circuit design; and generating test templates based on merging the residual test cubes. The merging may continue until a number of toggling points reaches a predetermined threshold. The method may further comprise: generating a plurality of test patterns and/or compressed test cubes based on one of the test templates.

The signal probability analysis may comprise: injecting a fault into the circuit design; computing signal probability values along propagation paths; and determining probabilistic test cube profile based on the signal probability values. The signal probability analysis may further comprise: generating a residual test cube for the fault by keeping specified bits that have signal probability values above a predefined threshold.

The generating test templates may comprise: determining fewest toggling points for a merged residual test cube. The generating test templates may be based at least in part on spacing between neighboring toggling points.

In another aspect, there are one or more non-transitory computer-readable media storing computer-executable instructions for causing one or more processors to perform the method recited above.

In still another aspect, there is a system, comprising: a residual test cube generation unit configured to generate residual test cubes for a plurality of faults based on a signal probability analysis of a circuit design; and a test template generation unit configured to generate test templates based on merging the residual test cubes.

The system may further comprise a test pattern generation/compression unit configured to generate test patterns/compressed test patterns based on the test templates.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to creating test templates for test pattern generation. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

Figure 1:
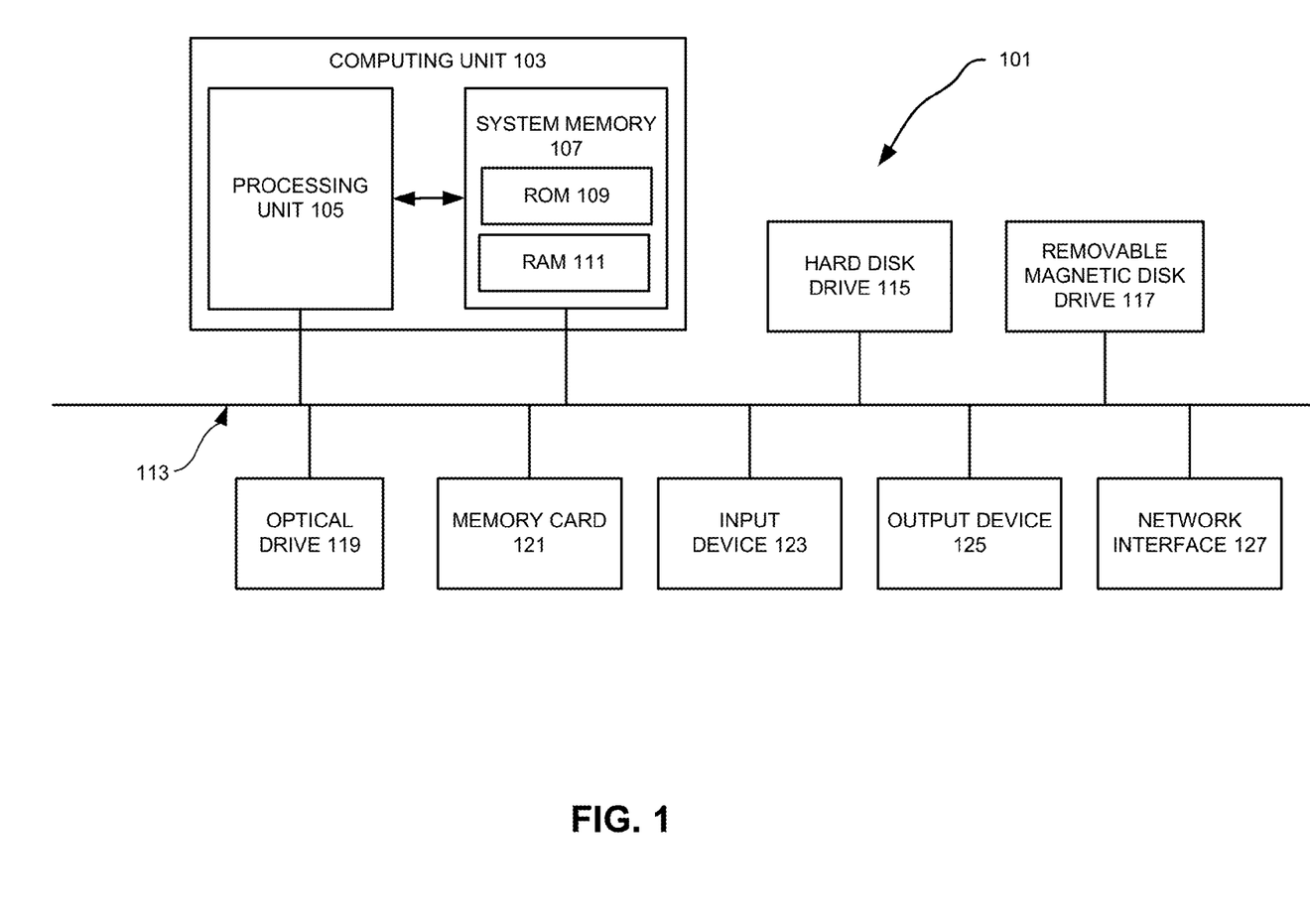
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Decompressor and Test Template

Figure 2A:
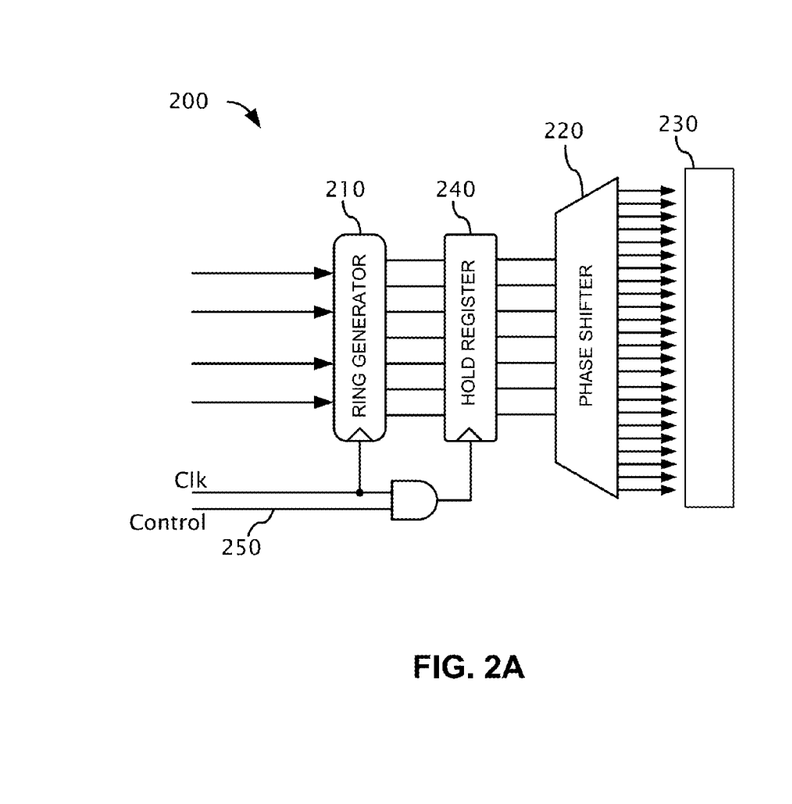
FIG. 2A illustrates a low power decompressor based on the EDT technology.

FIG. 2A illustrates a low power decompressor based on the EDT technology. The low power decompressor 200 comprises a ring generator 210 and a phase shifter 220 driving scan chains 230. Compressed test patterns are delivered to the decompressor 200 through c external channels such that a new c-bit vector is injected into the ring generator 210 every scan shift cycle. Furthermore, a hold register 240 is placed between the ring generator 210 and the phase shifter 220. It captures and saves certain states of the ring generator 210. As a result, the toggling-free data can be provided to the scan chains 230 for a number of continuous shift cycles, while the ring generator 210 keeps advancing to the next states needed to encode another group of specified bits.

An additional input channel 250 facilitates operations of the hold register 240. A control bit is then sent to the decompressor 200 every shift cycle in order to indicate whether the hold register 240 is to be updated with the current content of the ring generator 210. If so, such a time will be referred to as a toggle point. Two successive toggle points determine a hold period. A toggle point, however, does not indicate there is necessarily a change of values for a particular scan chain. Additional details concerning the decompressor 200 and the related technology are found in G. Mrugalski, J. Rajski, D. Czysz, and J. Tyszer, *Proc. DAC*, pp. 539-544, 2007, and U.S. Pat. Nos. 7,647,540, 7,797,603; 8,015,461, 8,046,653, and 8,301,945, all of which are hereby incorporated herein by reference.

Figure 2B:
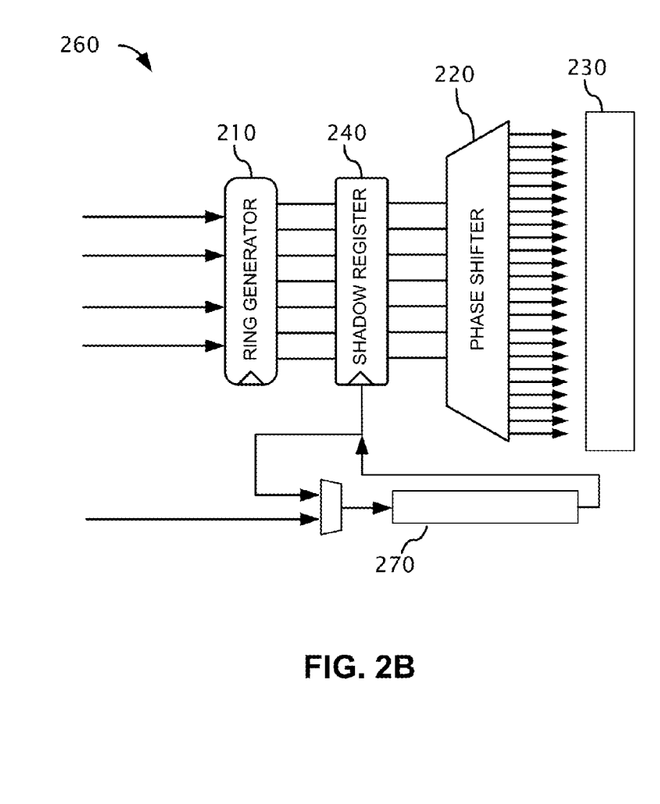
FIG. 2B illustrates an example of an EDT-based decompressor that may be used to decompress compressed test patterns generated according to various embodiments of the disclosed technology.

FIG. 2B illustrates an example of an EDT-based decompressor that may be used to decompress compressed test patterns generated according to various embodiments of the disclosed technology. It should be appreciated, however, that the disclosed technology can be applied to different test compression schemes or even be applied to test schemes without test compression.

Unlike the decompressor 200, the decompressor 260 shown in FIG. 2 uses a template register 270 rather than the additional channel 250 to control the hold register 240. The content stored in the template register 270 is called a test template. The size of the template register 270 matches the length of the longest scan chain. A test template is usually generated for a plurality of compressed test patterns. For example, sixty-four compressed test patterns use a test template. Accordingly, the template register 270 is updated once every sixty-four test patterns being applied.

Figure 3:
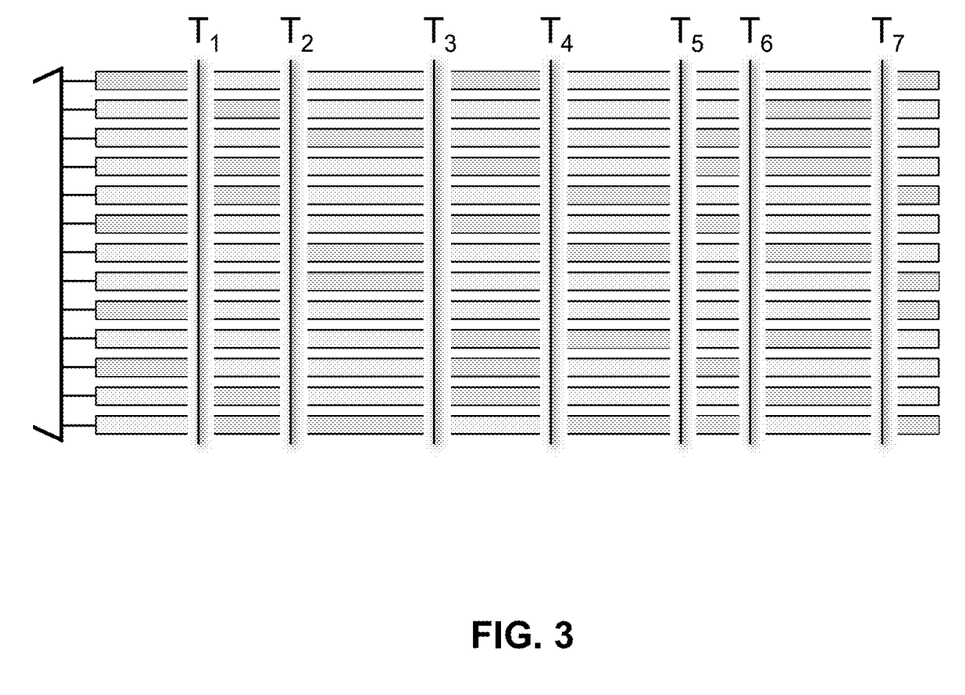
FIG. 3 illustrates an example of a test template and one of its associated decompressed test patterns.

An example of a test template and one of the associated decompressed test patterns are shown in FIG. 3. The test template 300 is shown with seven toggle points ($T_1$, $T_2$, ..., $T_7$). At each of the toggle points, bit values change for only some of the scan chains in this example, as indicated by color changes (the two colors indicate logic values of 0 and 1).

As shown in FIG. 3, a test template partitions a specific test cube into several transition-free hold periods, each comprising a certain number of consecutive slices. The actual fill rate (the number of specified bits) does not have to be either a compression-limiting factor or a low switching activity constraint. For example, having the same logic value assigned to several cells hosted by the very same scan chain may ease problems related to both compression and toggling challenges. Only specified bits occurring at toggle points must be encoded, whereas bits of the same value make it possible to deliver identical test data to scan chains for a number of shift cycles, thereby reducing the number of transitions.

Figure 4:
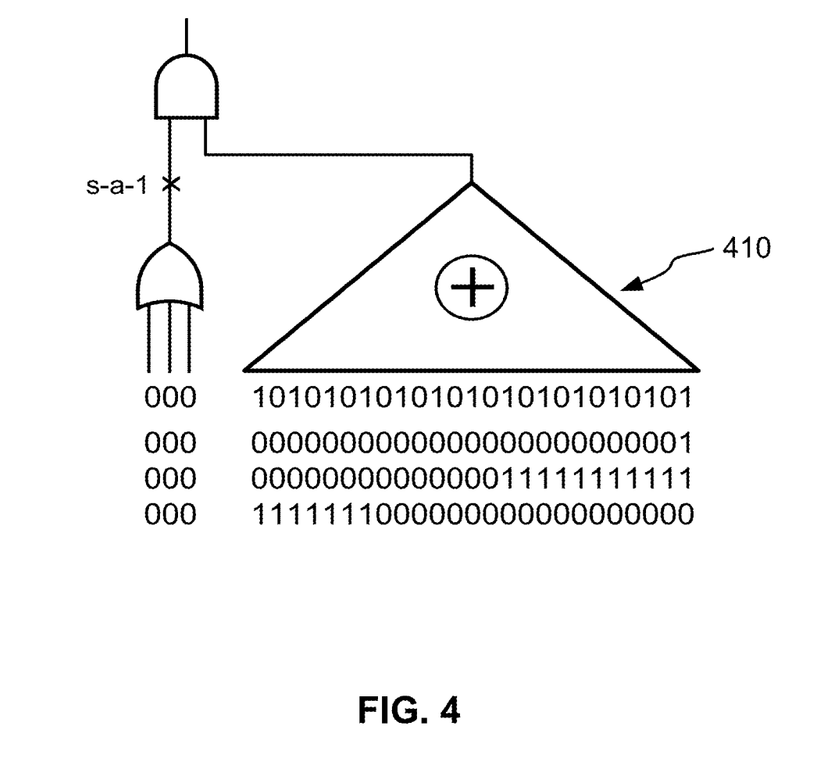
FIG. 4 illustrates an example that multiple test patterns activate the same fault.

Consider an example shown in FIG. 4. Let a circuit under test feature 28 inputs. A part of this device is an XOR tree 410. In order to detect an indicated stuck-at-1 fault, one can alternatively apply test patterns listed in the figure. The number of specified bits that have to be encoded within the first vector is equal to 3+25=28, whereas to encode one of the remaining patterns it suffices to target only 3+2 specified bits. Indeed, the specified values of 0 (1) occur here in sequences no interspersed with 1-bits (0-bits) and thus can be obtained by using the hold functionality since the decompressor outputs can be sustained to deliver the identical test data for a number of shift cycles. Clearly, it is easier to encode just 5 values (and update the hold register) than to handle 28 specified locations (especially if they occur in different scan chains).

To achieve it, a test template is generated first and then used to guide ATPG. The resultant test patterns can be highly compressible while scan toggling remains within acceptable limits. Because of their high fill rates and peculiar form (many bits of the same value populating the same scan chain), these test vectors may be further referred to as isometric patterns.

It is worth noting that one of the scan chains may be used as the template register 270 thus minimizing the proposed test logic silicon area.

Residual Test Cubes

The vast majority of test data compression schemes work with the concept of a test cube for a fault. A test cube is a partially specified vector with 0 s, 1 s, and don't care bits (unspecified bits). Any test vector (pattern) formed from the test cube is a test pattern for the fault. A large body of experimental data shows that test cubes, even those generated with a dynamic compaction targeting multiple faults and performing multiple clock compression, have fill rates anywhere in the range from 0.2% to 5%. Typically, however, more than one test cubes can detect a specific fault. These test cubes usually share 10% (or less) of the specified bits. In another word, only 10% (or less) of the specified bits in a test cube are essential, i.e., these specified values cannot be replaced with specified values in other locations. The remaining 90% positions are flexible, and one can take advantage of this phenomenon to further improve test compression.

Figure 5:
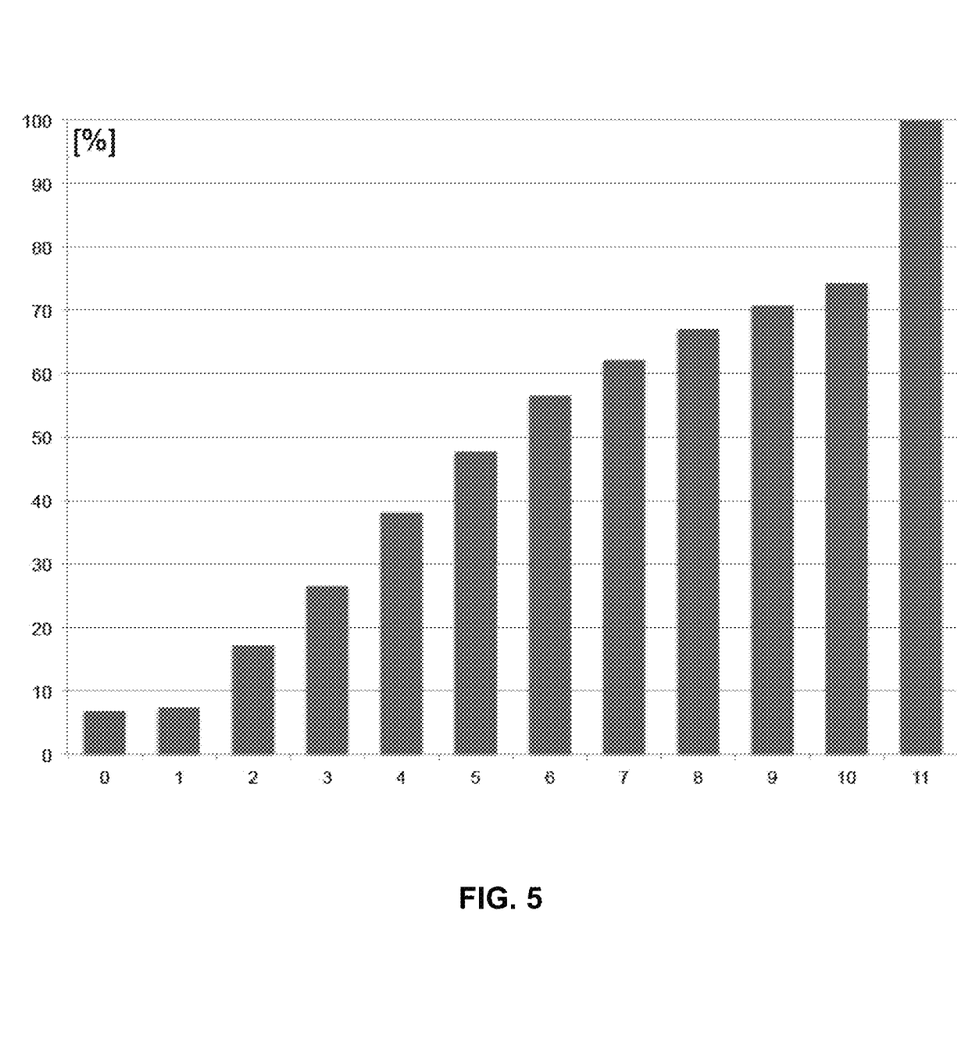
FIG. 5 illustrates an example of a specified bits profile for a large industrial design.

The above phenomenon is illustrated in FIG. 5, which is an example of a specified bits profile for a large industrial design. The diagram is a cumulative histogram H obtained for 1,000 test patterns having on the average 29,473 specified bits. Entry H(k) to the histogram indicates the average percentage of bits that ATPG may assign a specified value with the probability greater than or equal to $2^{-k}$. For example, H(0)=6.82 means that 6.82% of all specified bits are essential, whereas H(3)=24.47 indicates that 24.47% of positions in total can be assigned specified values with the probability greater than or equal to $2^{-3}$=0.125.

In this disclosure, a residual test cube for a fault is a partially specified vector—not all specified bits are retained. A partially specified vector, for example, may be defined as a vector that retains only those positions of the regular test cube that correspond to primary inputs and scan cells whose likelihood of being specified is greater than a predetermined threshold. In particular, specified values of all essential scan cells become unconditional parts of a residual test cube. Not every vector contained in a residual cube is a test because of not yet specified bits that can be determined in several other ways. However, if a fault is testable, then ATPG will eventually find a test vector within its residual cube by replacing some don't-care bits with specified values.

Scan Cell Selection Tools and Methods

Figure 6:
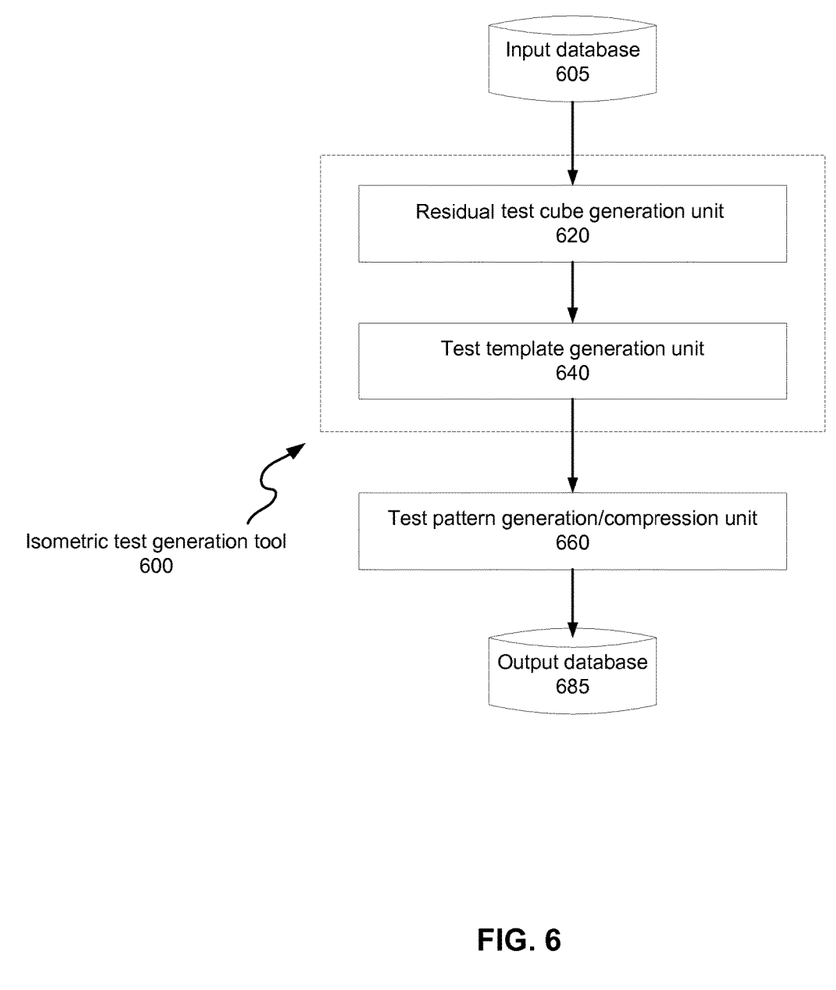
FIG. 6 illustrates an example of an isometric test generation tool according to various embodiments of the disclosed technology.

FIG. 6 illustrates an example of an isometric test generation tool according to various embodiments of the disclosed technology. As seen in the figure, the isometric test generation tool 600 includes three units: a residual test cube generation unit 620 and a test template generation unit 640. Some implementations of the isometric test generation tool 600 may cooperate with or incorporate one or more of a test pattern generation/compression unit 660, an input database 605, and an output database 685.

As will be discussed in more detail below, the residual test cube generation unit 620 generates residual test cubes for a plurality of faults based on a signal probability analysis of a circuit design. The test template generation unit 640 then generates test templates based on merging the residual test cubes. The test pattern generation/compression unit 660 may generate test patterns and/or compressed test patterns based on the test templates.

As previously noted, various examples of the disclosed technology may be implemented by a computing system, such as the computing system illustrated in FIG. 1. Accordingly, one or more of the residual test cube generation unit 620, the test template generation unit 640, and the test pattern generation/compression unit 660 may be implemented by executing programming instructions on one or more processors in a computing system such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the residual test cube generation unit 620, the test template generation unit 640, and the test pattern generation/compression unit 660. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

It also should be appreciated that, while the residual test cube generation unit 620, the test template generation unit 640, and the test pattern generation/compression unit 660 are shown as separate units in FIG. 6, a single computer (or a single processor within a master computer) may be used to implement two or more of these units at different times, or components of two or more of these units at different times.

With various examples of the disclosed technology, the input database 605 and the output database 685 may be implemented using any suitable computer readable storage device. That is, either of the input database 605 and the output database 685 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any other non-transitory storage medium that can be used to store desired information. While the input database 605 and the output database 685 are shown as separate units in FIG. 6, a single data storage medium may be used to implement some or all of these databases.

Figure 7:
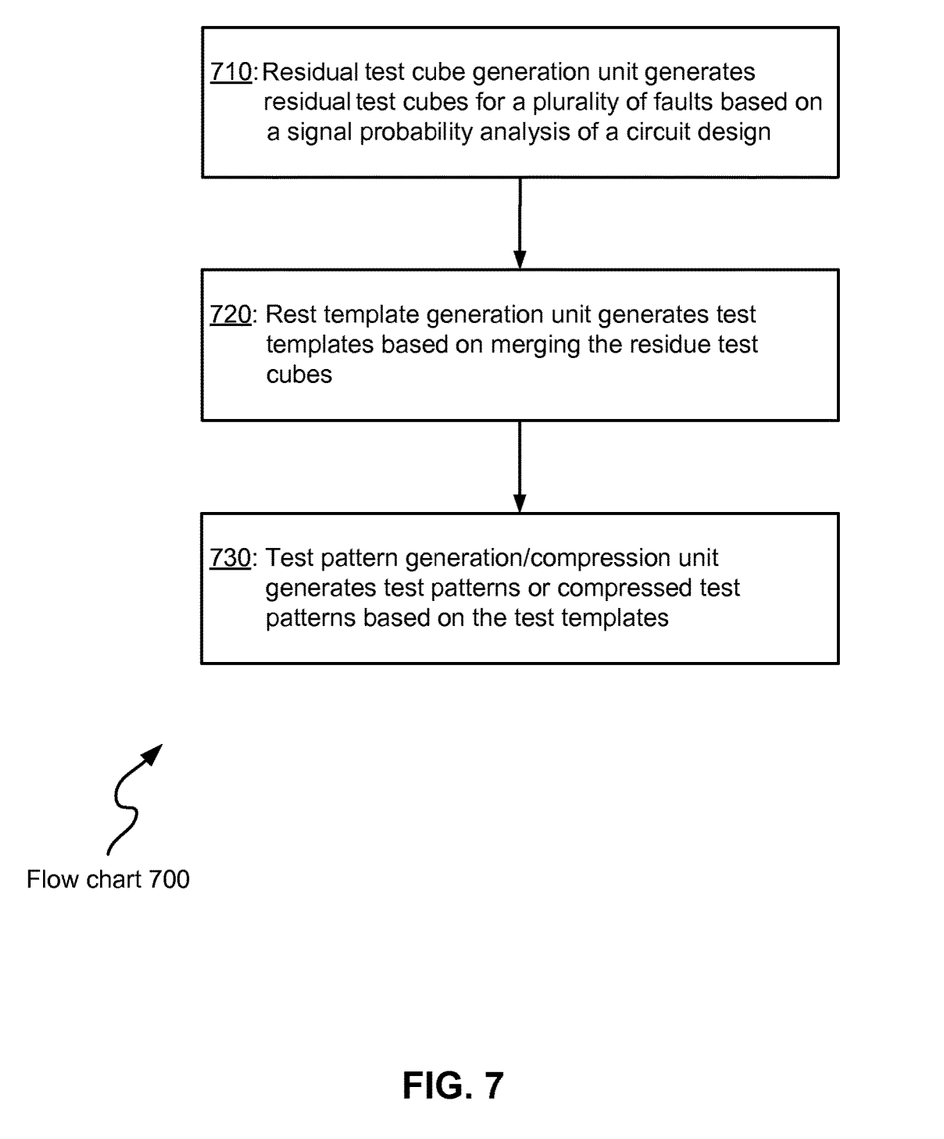
FIG. 7 illustrates a flowchart showing a process of test template generation that may be implemented according to various examples of the disclosed technology.

FIG. 7 illustrates a flowchart 700 showing a process of test template generation that may be implemented according to various examples of the disclosed technology. For ease of understanding, methods of test template generation that may be employed according to various embodiments of the disclosed technology will be described with reference to the isometric test generation tool 600 illustrated in FIG. 6 and the flow chart 700 in FIG. 7. It should be appreciated, however, that alternate implementations of an isometric test generation tool may be used to perform the method of test template generation in the flow chart 700 according to various embodiments of the disclosed technology. In addition, it should be appreciated that implementations of the isometric test generation tool 600 may be employed to implement methods of test template generation according to different embodiments of the disclosed technology other than the one illustrated by the flow chart 700 in FIG. 7.

Initially, in operation 710 of the flow chart 700, the residual test cube generation unit 620 generates residual test cubes for a plurality of faults based on a signal probability analysis of a circuit design. As noted before, a residual test cube for a fault is a test cube that keeps only a portion of the specified bits needed for detecting the fault, and these retained specified bits have probability values for being specified greater than a predetermined threshold. With various implementations of the disclosed technology, the signal probability analysis comprises computing probabilistic test cube profiles. To compute a probabilistic test cube profile for a fault, the fault may be injected into the design. Signal probabilities along its propagation paths are then determined. A propagation path connects the fault to an observation point (a primary output or a scan cell).

If there is a unique fault propagation path, the corresponding probabilities may be set to 1. Probabilities associated with branches of a fan-out are equal fractions (inversely proportional to the number of branches) of the probability that the fault can reach the stem. In a backward implication process, inputs assume the values based on the corresponding outputs. In the off-path implication phase, inputs assume the same non-controlling value as that of the fault propagation. Finally, in the backward justification, the number of inputs divides the output signal probability. From the test cubes and the resultant probabilistic test cube profiles, the residual test cube generation unit 620 may derive the residual test cubes by keeping only specified bits with the corresponding signal probabilities greater than a certain threshold.

Next, in operation 720, the test template generation unit 640 generates test templates based on merging the residual test cubes. Conventional cube merging rules may be employed. For example, two residual test cubes can be merged if they are compatible, i.e., if in every position where one cube has a value of 0 or 1, the other one either features the same value or don't care. This process may terminate when the number of toggle points associated with the resultant residual test cube exceeds a user-defined threshold.

A toggle point is where one or more of the scan chains change their content values. As discussed previously, the hold register is updated from the ring generator at a toggle point. If two adjacent scan cells require different values in their residual test cube, then a toggle point is uniquely determined and is referred to as a prime toggle point. If two successively specified values in a residual cube are separated by scan cells with don't care values, then a toggle point can be placed anywhere between these scan cells provided they have different values. Otherwise, there is no need to add any toggle point.

When toggling points are too close to each other, the test power consumption may be too high. Accordingly, the test template generation unit 640 may use the spacing between neighboring toggle points as one criterion for deciding whether the merging process should be terminated and/or where to insert a non-prime toggle point.

Figure 8A:
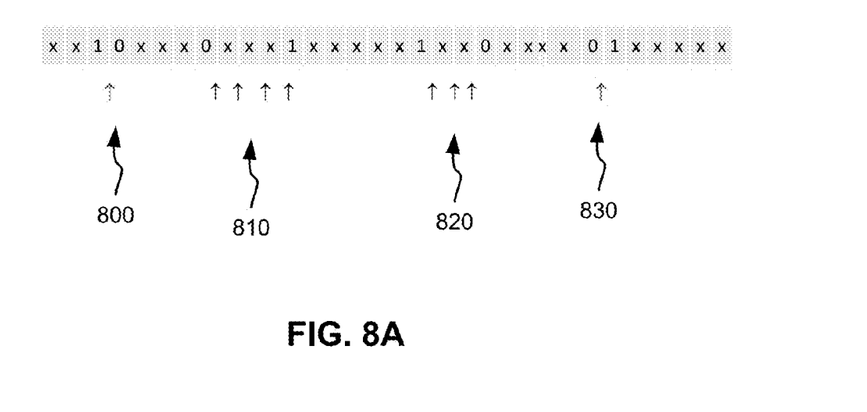
FIG. 8A illustrates an example of a residual test cube.

FIG. 8A illustrates an example of a residual test cube. Four toggle points are needed.

Among them, toggle points 800 and 830 are prime toggle points while toggle points 810 and 820 can be placed anywhere between the values 0 and 1 and between the values of 1 and 0, respectively.

In operation 730, the test pattern generation/compression unit 660 may generate test patterns and/or compressed test patterns based on the test templates. A test template can direct ATPG to produce highly compressible test cubes. The test template may be passed to ATPG to make it aware of additional constraints—the locations of toggle points. As shown in FIG. 3, the test template divides scan chains into hold periods. Within each period only one polarity value is used. Hence, all scan cells within a period will have the same value and ATPG will consider all of them as equivalent. In the case of EDT, they all will have exactly the same linear equation. ATPG and EDT-based compression may iterate until a certain number of test patterns (e.g., 64) compliant with the newly created test template are produced or a user-defined abort limit is reached. These test patterns are then fault simulated, and the fault list is updated accordingly. If there are still faults on the list, the method goes back to pick new faults and to create new residual test cubes. Otherwise, the whole procedure stops. One detailed implementation example of the flow chart 700 is illustrated in FIG. 9.

Figure 8B:
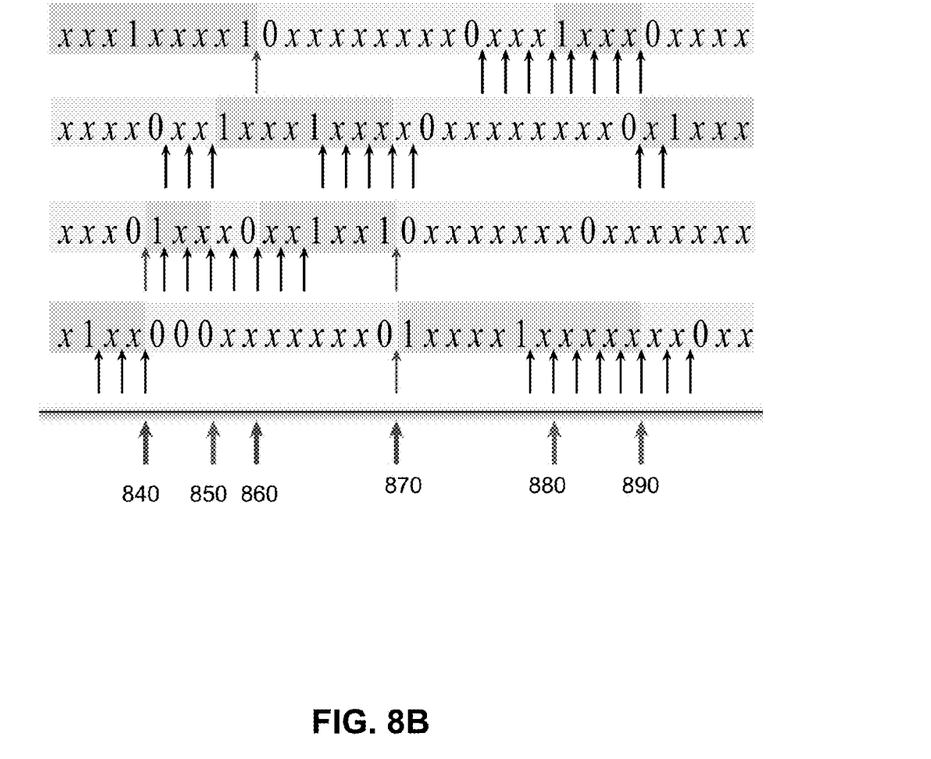
FIG. 8B illustrates a test template for a multi scan chain residual test cube.
Figure 9:
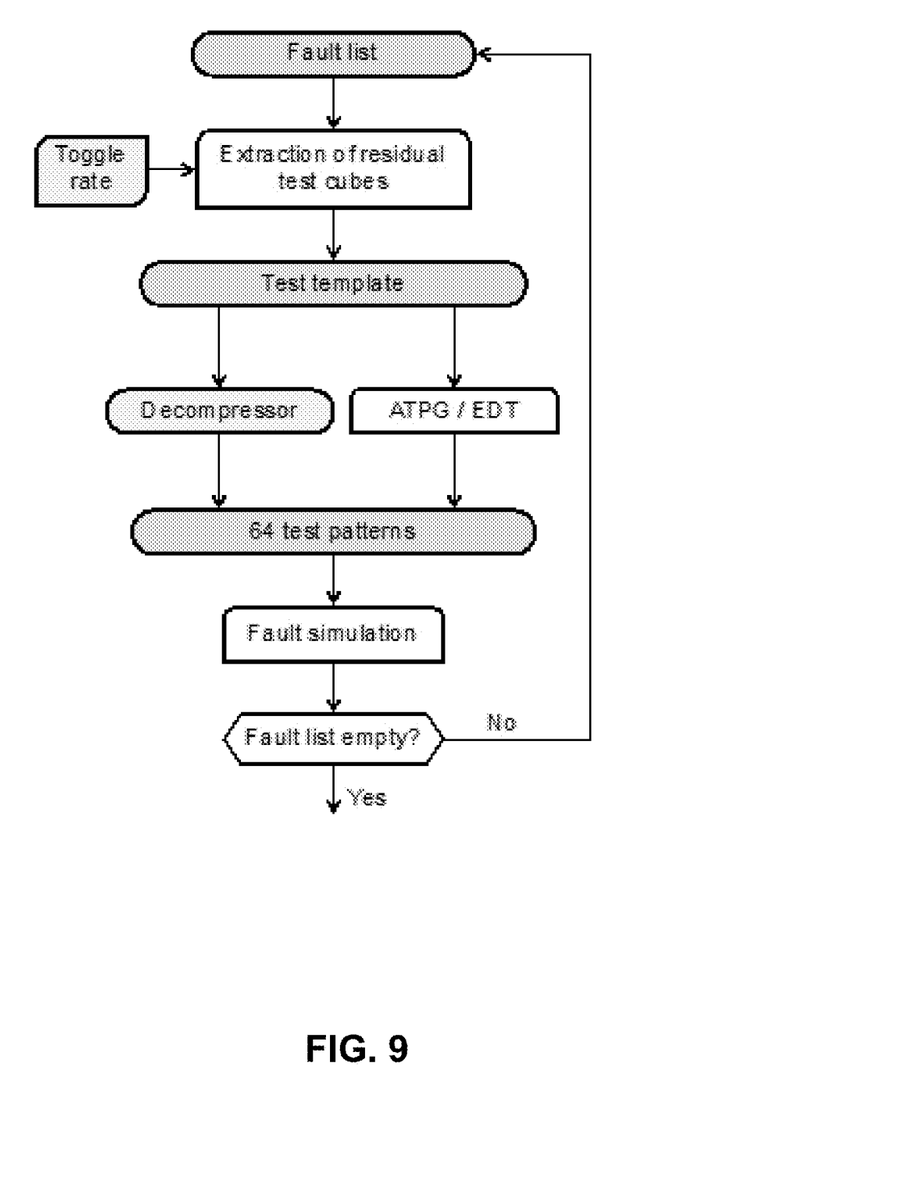
FIG. 9 illustrates a detailed implementation example of the flow chart 700.

As the example in FIG. 9 shows, a test template is computed once merging of residual test cubes is completed. The residual test cube is first mapped into a list of transitions. Each transition is determined by two successive specified bits of the opposite values located in the same scan chain. In addition to its flanking bits x and y, each transition is characterized by a duration, i.e., the number of clock cycles separating x from y. It is worth noting that some specified bits contribute to two transitions, whereas other bits are not involved in forming any transitions. Having instantiated an empty test template, the corresponding list of transitions is then used to arrive with the locations of toggle points such that each transition is covered by at least one toggle point. As can be easily verified, this is a peculiar instance of the set covering problem. In particular, transitions of duration y−x=1 determine prime toggle points. This process may begin with the most populated scan chain and attempts, in a greedy fashion, to select a suitable subset of toggle point locations whose sum covers all transitions in all scan chains. A solution must enclose all prime toggle points unless two or more prime toggle points are aligned. In this case, a single toggle point is sufficient. If their sites overlap with transitions in other scan chains, these transitions are covered, as well. Otherwise, the algorithm continues to look for the fewest toggle points occurring within the remaining transitions. A resultant test template for a multi scan chain residual test cube is illustrated in FIG. 8B. The selected toggle points are printed in red (prime toggle points) and in blue (the remaining accepted points).

Having instantiated a test template, all hold periods where the scan cells assume the same value can be readily determined (see FIG. 8B), i.e., they become ATPG equivalent. If ATPG assigns a certain logic value to one of the scan cells within a given period, it subsequently copies that value to the remaining cells of the same period, and propagates these values back to the circuit. Moreover, the EDT solver may assume that the same equation is associated with these cells. As a result, only the first cell of the period becomes the subject of encoding—this is exactly the only cycle when the hold register can be reloaded with the new content of the ring generator.

CONCLUSION

While the disclosed techniques has been described with respect to specific examples including presently preferred modes of carrying out the disclosed techniques, those skilled in the art will appreciate that there are numerous variations and permutations of the above described systems and techniques that fall within the spirit and scope of the disclosed techniques as set forth in the appended claims. For example, while specific terminology has been employed above to refer to electronic design automation processes, it should be appreciated that various examples of the disclosed techniques may be implemented using any desired combination of electronic design automation processes.

What is claimed is:

1. A method comprising:
for each of a plurality of faults, determining, by one or more computing devices, a plurality of probability values associated with observing a fault along a plurality of propagation paths of a circuit design;
generating, by the one or more computing devices, a plurality of residual test cubes by at least, for each of the plurality of faults, generating a corresponding residual test cube for the fault based on determining that one or more from the plurality of probability values are above a predefined threshold; and
generating, by the one or more computing devices, test templates based on merging the plurality of residual test cubes.

2. The method recited in claim 1, further comprising:
generating a plurality of test patterns based on one of the test templates.

3. The method recited in claim 1, further comprising:
generating a plurality of compressed test patterns based on one of the test templates.

4. The method recited in claim 1, further comprising:
injecting, for each of the plurality of faults, the fault into the circuit design; and
determining, for each of the plurality of faults, a probabilistic test cube profile based on the plurality of probability values.

5. The method recited in claim 4, wherein the generating the corresponding residual test cube for the fault is performed by keeping specified bits that have probability values above the predefined threshold.

6. The method recited in claim 1, further comprising:
continuing the merging until a number of toggling points reaches a predetermined threshold.

7. The method recited in claim 1, wherein the generating the test templates comprises:
determining a fewest number of toggling points for a merged residual test cube.

8. The method recited in claim 1, wherein the generating the test templates is based at least in part on spacing between neighboring toggling points.

9. One or more non-transitory computer-readable media storing executable instructions that, when executed, cause one or more processors to:
for each of a plurality of faults, determine a plurality of probability values associated with observing a fault along a plurality of propagation paths of a circuit design;
generate a plurality of residual test cubes by at least, for each the plurality of faults, generating a corresponding residual test cube for the fault based on determining that one or more from the plurality of probability values are above a predefined threshold; and
generate test templates based on merging the plurality of residual test cubes.

10. The one or more non-transitory computer-readable media recited in claim 9, wherein the executable instructions, when executed, cause the one or more processors to:
generate a plurality of test patterns based on one of the test templates.

11. The one or more non-transitory computer-readable media recited in claim 9, wherein the executable instructions, when executed, cause the one or more processors to:
generate a plurality of compressed test patterns based on one of the test templates.

12. The one or more non-transitory computer-readable media recited in claim 9, wherein the executable instructions, when executed, cause the one or more processors to:
inject, for each of the plurality of faults, the fault into the circuit design; and
determine, for each of the plurality of faults, a probabilistic test cube profile based on the plurality of probability values.

13. The one or more non-transitory computer-readable media recited in claim 12, wherein generating the corresponding residual test cube for the fault is performed by keeping specified bits that have probability values above the predefined threshold.

14. The one or more non-transitory computer-readable media recited in claim 9, wherein the executable instructions, when executed, cause the one or more processors to continue the merging until a number of toggling points reaches a predetermined threshold.

15. The one or more non-transitory computer-readable media recited in claim 9, wherein causing the one or more processors to generate the test templates comprises causing the one or more processors to:
determine a fewest number of toggling points for a merged residual test cube.

16. The one or more non-transitory computer-readable media recited in claim 9, wherein causing the one or more processors to generate the test templates comprises causing the one or more processors to generate the test templates based at least in part on spacing between neighboring toggling points.

17. The method of claim 1, wherein the plurality of probability values indicates whether there is a unique propagation path for observing the fault.

18. A method comprising:
determining, by one or more computing devices, a first probability associated with observing a first fault along at least one propagation path of a circuit design;

determining, by one or more computing devices, a second probability associated with observing a second fault along at least one propagation path of the circuit design;

based on the first probability or the second probability being above a threshold, generating, by the one or more computing devices, a residual test cube that includes the first probability or the second probability; and generating, by the one or more computing devices, test templates based on the residual test cube.

19. The method recited in claim 18, wherein the first probability indicates that there is a unique propagation path for observing the first fault.

20. The method recited in claim 18, wherein the second probability indicates that there are two or more propagation paths for observing the first fault.

* * * * *